United States Patent [19]

Gerst et al.

[11] 4,277,748
[45] Jul. 7, 1981

[54] ANGLE DIGITIZER

[75] Inventors: Carl W. Gerst, Skaneateles; Leonard J. Paciorek, North Syracuse, both of N.Y.

[73] Assignee: Anaren Microwave, Incorporated, Syracuse, N.Y.

[21] Appl. No.: 70,687

[22] Filed: Aug. 29, 1979

[51] Int. Cl.³ .......................................... G01R 25/00
[52] U.S. Cl. ............................. 324/83 D; 324/83 Q; 324/DIG. 1; 235/92 PS
[58] Field of Search ............... 324/83 R, 83 D, 83 Q, 324/DIG. 1, 79 D, 86; 235/92 PS

[56] References Cited

U.S. PATENT DOCUMENTS

| | | | |
|---|---|---|---|
| 3,286,176 | 11/1966 | Birnboim | 324/83 D |
| 3,428,865 | 2/1969 | Opad | 324/86 |
| 3,505,593 | 4/1970 | Gram et al. | 324/83 D |

*Primary Examiner*—Michael J. Tokar
*Attorney, Agent, or Firm*—Hane, Roberts, Spiecens & Cohen

[57] ABSTRACT

An angle digitizer receives signal representing the sine and cosine of the angle to be digitized. The voltages are fed to orthogonal pairs of input terminals. Between each two input terminals is a set of equivalued resistors to form a resistor ring. At the junction of each pair of resistors is an output terminal. Each pair of output terminals is connected to the input terminals of a signal amplitude comparator which compares the magnitude of the signals at its inputs to give a digital signal in accordance with which is greater. For each comparator the output terminals of the resistor ring are selected such that the signals are in a direct antiphase relationship.

7 Claims, 2 Drawing Figures

ANGLE DIGITIZER

BACKGROUND OF THE INVENTION

This invention pertains to apparatus for converting signals representing trigonometric functions of angles to coded combinations of binary signals representing the angles.

In measuring the frequency of microwave signals, or the bearing angle of incoming radar signals, or the polarization of such signals, as well as phase differences, correlators are used. The outputs of the correlators are generally signals which are sine and cosine functions of a phase angle. At first these signals were displayed on a calibrated CRT display. As time progressed much greater accuracies were required.

The art started to move toward digital techniques. Typical devices as analog signal processors are shown in U.S. Pat. No. 3,800,221 issued Mar. 26, 1974. These signal processors while they satisfied the need were complex and cumbersome and created the demand for even better digitizers.

SUMMARY OF THE INVENTION

It is accordingly a general object of the invention to provide an improved angle digitizer.

Briefly, the invention contemplates apparatus for converting signals representing $\sin\theta$ and $\cos\theta$ to a digital value representing the angle $\theta$. The signal representing $\sin\theta$ is connected across a set of first and second input terminals and the signal representing $\cos\theta$ is connected across another set of third and fourth input terminals. Between each two input terminals there is connected a set of the same number of equivalent impedors to form a ring. At the junction of each pair of adjacent impedors there is an output terminal. A plurality of two-input logic means which give binary signals at their outputs are connected to the output terminals of the ring. In particular each logic means is connected to a pair of output terminals which are in an antiphase relationship.

BRIEF DESCRIPTION OF THE DRAWING

Other objects, the features and advantages of the invention will be apparent from the following detailed description of the invention when read with the accompanying drawing which shows the presently preferred embodiment of the invention. In the drawing.

DESCRIPTION OF THE PREFERRED EMBODIMENT

Figures 1, 2:
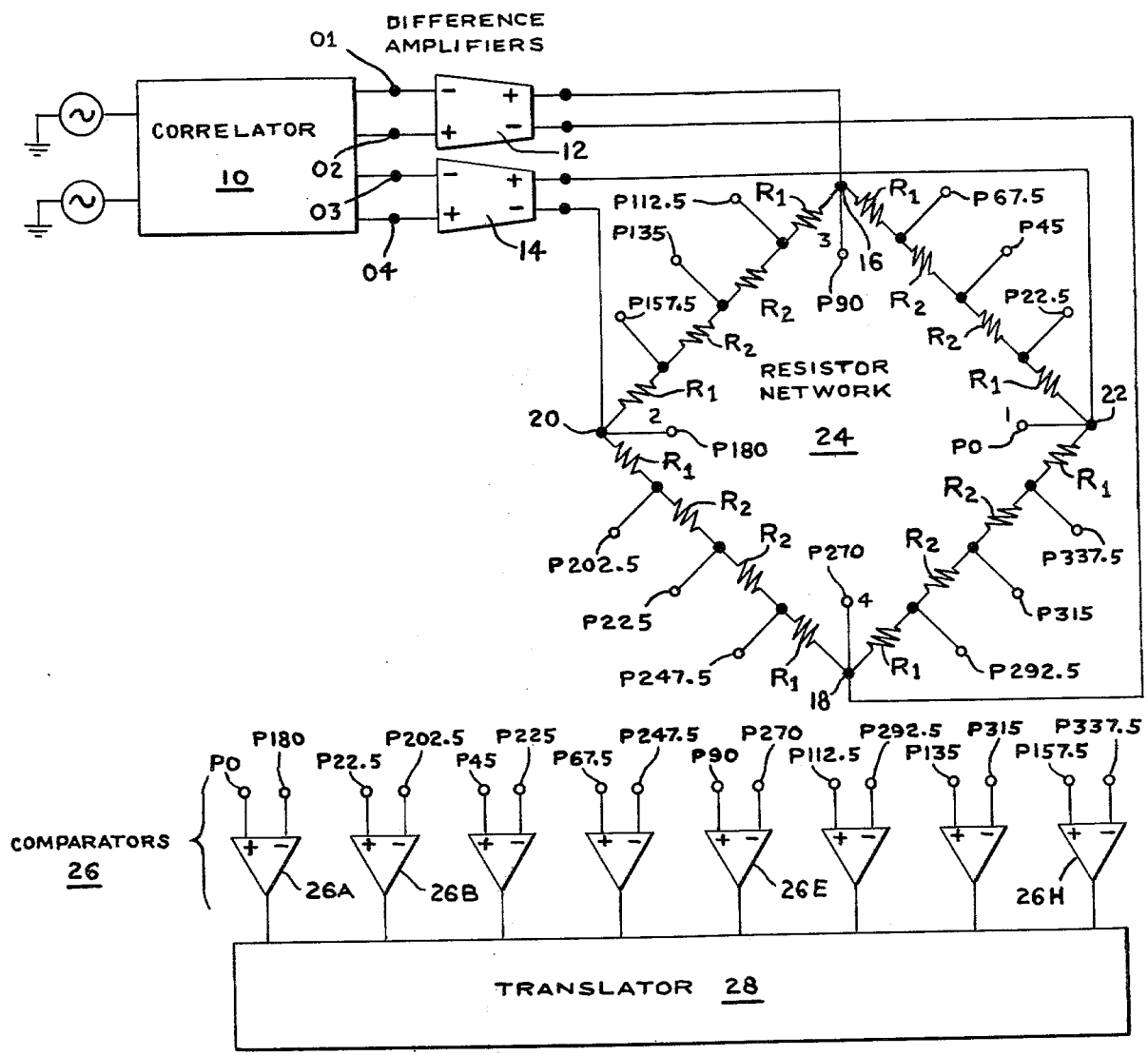
FIG. 1 is a block diagram of apparatus for digitizing analog angle-representing signals.
FIG. 2 is a table showing the digital codes generated for angles in 22.5° increments.

In FIG. 1 the correlator 10 receives two signals whose phase difference is to be measured. A typical correlator can be that shown in my U.S. Pat. No. 3,517,309 up to the outputs of the low pass filters LP1 to LP4 which are then connected to the terminals O1 to O4 of the present FIG. 1.

The terminals O1 and O2 are connected to the negative and positive input terminals of balanced difference amplifier 12 which emits across its positive and negative output terminals a signal proportional to $\sin\theta$, where $\theta$ is the phase difference between the two signals whose phase difference is being measured. Similarly the terminals O3 and O4 are connected to the negative and positive input terminals of balanced difference amplifier 14 which emits across its positive and negative output terminals a signal proportional to $\cos\theta$, where $\theta$ is the phase difference between the two signals whose phase difference is being measured.

The output terminals of the difference amplifiers 12 and 14 are connected to input terminals of resistor network 24. The resistor network has four input terminals 16, 18, 20 and 22. The pair of input terminals 16 and 18 are connected to the output terminals of amplifier 12 so that a signal proportional to $\sin\theta$ is developed across terminals 16 and 18. The pair of input terminals 20 and 22 are connected to the output terminals of amplifier 14 so that a signal proportional to $\cos\theta$ is developed across terminals 20 and 22. Between input terminal 16 and input terminal 20 there is a set of weighted resistors $R_1$, $R_2$, $R_2$ and $R_1$. Between input terminals 20 and 18 there is an equivalent set of the resistors. Similarly between input terminals 18 and 22 and input terminals 22 and 16. The number of resistors in each set must be the same. The number is chosen based on the desired resolution. The resolution is determined by the following formula Resolution $= \theta = 360°/4n$ where n is the number of resistors in a set. In FIG. 1, by way of example, there are four resistors per set. Hence, the resolution is 22.5°.

The values of the resistors are chosen according to the following formula $$R_N = \frac{1}{1 - \tan[-90° + N\theta]} - \frac{1}{1 - \tan[-90° + (N+1)\theta]};$$

where $\theta$ is definite above; and N=the numerical position of the resistor with respect to the output terminals. Thus, $R_1 = 0.293$ R; and $R_2 = 0.207$ R; where R is the total resistance between a pair of output terminals.

Although the resistor layout in FIG. 1 is shown as a square it can be called a ring as long as it has the following properties. The input terminals of each pair must be separated by 2n resistors. Thus, in FIG. 1 the pair of terminals 16 and 18 are separated by eight resistors and the pair of input terminals 20 and 22 are separated by eight resistors. The connection between any two input terminals one from each pair is only by one set of serially connected resistors.

Connected to the junction of each adjacent pair of resistors R is and output terminal PN. In FIG. 1 the output terminals have been given reference numerals equivalent to angular relationships assuming the output terminal PO connected to terminal 22 is considered zero phase and the sine and cosine inputs are as stated above. There is a defined relationship between pairs of output terminals. A pair of output terminals is considered in antiphase when and only when 2n resistors separate the two terminals around the loop. For tutorial reasons the output terminals have been reference numerals equivalent to the direction of a radius vector for the heretofore used CRT display devices.

The pairs of output terminals in antiphase relationship are connected to the inputs of 2n two-input logic means in the form of signal magnitude comparators 26. Since for the present example there are four resistors per set there are eight comparators 26A to 26H. These comparators can take many forms but for the preferred embodiment it is assumed that the signals at the outputs of the amplifiers 12 and 14 swing about a positive quiescent level of such amplitude that the signals at the output terminals PN never go negative. Therefore, the comparators are such that whenever the signal at a (+) input is greater than the signal at a (−) input the comparator output is high or "1". Otherwise, the comparator output is low or "0".

In FIG. 2 there is shown the outputs of the comparators 26A to 26H for the sixteen angle quanta possible with the resolution obtained for 4n resistors. While this digital code is useful and unique to the angles, it is the usual case to translate this code into a straight binary or binary-coded decimal code. Such translation is performed by translator 28 which can be a read only memory acting as a function table. For example, it would translate the digital code 1111000 to 0000 in binary code and the digital code 11100000 to 1111 in binary code. Such techniques are well known in the art and will not be discussed.

The apparatus operates as follows: correlator 10 receives the two signals whose phase difference is to be measured and transmits signals to balanced difference amplifiers 12 and 14. Across terminals 16 and 18 there is developed a signal proportional to sin $\theta$ while across terminals 20 and 22 there is developed a signal proportional to cos $\theta$. Hence at each output terminal PN there is a signal functionally related to the vector sum of sin $\theta$ and cos $\theta$. For example, assume that the phase difference difference is 0°, then there is no signal across terminals 16 and 18 (sin 0° = 0) and maximum signal between terminals 20 and 22 (cos 0° = 1) with terminal 22 positive with respect to terminal 20. Thus, the signals at output terminals P0, P22.5, P45, P67.5, P337.5, P315, and P292.5 are greater than at terminals P180, P202.5, P225, P247.5, P112.5, P135 and P157.5. Thus, the digital code will be 1111X000. There is ambiguity at comparator 26E since both inputs are zero. However, because of hysteresis and bias it could be forced to emit a low signal for this case.

In working systems there are included networks which sense for such ambiguities and rely on different criteria to resolve the ambiguity.

While only one embodiment of the invention has been shown and described in detail there will now be obvious to those skilled in the art many modifications and variations satisfying many or all of the objects of the invention without departing from the spirit thereof as defined by the appended claims.

What is claimed is:

1. Apparatus for converting a signal representing sin $\theta$ and a signal representing cos $\theta$ to a digital value representing the angle $\theta$ comprising: first and second input terminals across which is applied a signal proportional to sin $\theta$; third and fourth input terminals across which is applied a signal proportional to cos $\theta$; four sets of the same number of impedors, a first of said sets being connected between said first and third input terminals, a second of said sets being connected between said third and second input terminals, a third of said sets being connected between said second and fourth input terminals, a fourth of said sets being connected between said fourth and first input terminals; a plurality of output terminals, each of said output terminals being connected to the junction of each pair of adjacent impedors; and a plurality of two-input logic means for giving a first level signal at an output when the signal at one input is greater than the signal at the other input and for giving a second level signal at said output when the signal at said one input is less than the signal at said other input, the two inputs of each logic means being connected to a pair of said output terminals which have an antiphase relationship.

2. The apparatus of claim 1 wherein said impedors are resistors.

3. The apparatus of claims 1 or 2 wherein each of said logic means is a comparator.

4. The apparatus of claim 3 further comprising a first balanced difference amplifier having a pair of difference input terminals and two balanced output terminals connected to said first and second input terminals, respectively, and a second balanced difference amplifier having a pair of difference input terminals and two balanced output terminals connected to said third and fourth input terminals, respectively.

5. The apparatus of claim 4 further comprising a correlator means having two input ports for receiving signals whose phase difference is to be compared and two pairs of output ports for generating signals which are trigonometric functions of the phase difference between the received signals, said first pair of output ports being connected to the pair of difference input terminals of said first balanced difference amplifier, and said second pair of output ports being connected to the pair of difference input terminals of said second balanced difference amplifier.

6. The apparatus of claim 2 wherein said resistors are weighted.

7. The apparatus of claim 6 wherein the value of each resistor is chosen according to the formula:

$$R_N = \frac{1}{1 - \tan[-90° + N\theta]} - \frac{1}{1 - \tan[-90° + (N-1)\theta]};$$

wherein $\theta$ is the desired resolution = 360°/4n, n being an integer equal to the number of resistors between terminals; and where N is the numerical position of a resistor with respect to said output terminals.

* * * * *